United States Patent [19]

Ellsworth

[11] Patent Number: 4,470,852

[45] Date of Patent: Sep. 11, 1984

[54] METHOD OF MAKING CMOS DEVICE AND CONTACTS THEREIN BY ENHANCED OXIDATION OF SELECTIVELY IMPLANTED REGIONS

[75] Inventor: Daniel L. Ellsworth, Fort Collins, Colo.

[73] Assignee: NCR Corporation, Dayton, Ohio

[21] Appl. No.: 414,737

[22] Filed: Sep. 3, 1982

[51] Int. Cl.³ .................. H01L 21/225; H01L 21/265; B01J 17/00

[52] U.S. Cl. ...................................... 148/1.5; 29/571; 29/576 B; 29/578; 148/187; 357/42; 357/91

[58] Field of Search .................... 148/1.5, 187; 29/571, 29/578, 576 B; 357/42, 91

[56] References Cited

U.S. PATENT DOCUMENTS

| | | |
|---|---|---|
| 3,886,004 | 5/1975 | Bruchez . |
| 4,170,492 | 10/1979 | Bartlett et al. ........................ 148/1.5 |
| 4,265,685 | 5/1981 | Seki ..................................... 148/174 |
| 4,329,773 | 5/1982 | Geipel, Jr. et al. .................... 29/571 |
| 4,385,947 | 5/1983 | Halfacre et al. ...................... 148/187 |
| 4,391,650 | 7/1983 | Pfeifer et al. ......................... 148/1.5 |

OTHER PUBLICATIONS

Nomura et al., in Ion Implantation in S/C, Ed. Namba, Plenum, 1975, N.Y. p. 681.
"Polysilicon Oxidation Self-Aligned MOS (POSA MOS)—A New Self-Aligned Double Source/Drain Ion Implantation Technique for VLSI" by S. Hsia et al., IEEE Electron Device Letters, vol. EDL 3, No. 2, Feb. 1982, pp. 40–42.
"A New Self-Aligned Contact Technology" by Mitsuru Sakamoto et al., IC Division, Nippon Electric Company, Ltd., Sagamihara, Japan 1980 IEEE, pp. 136–139.
"High-Performance Transistors with Arsenic-Implanted Polysil Emitters" by Jurgen Graul et al., IEEE Journal of Solid-State Circuits, vol. SC-11, No. 4, Aug. 1976, pp. 491–495.
"Al/Poly-Si Metallization for Small Geometry, Shallow Junction Contacts and Fine Line Interconnects" by S. Vaidya, Bell Telephone Laboratories, ECS, p. 369.
"Electromigration in Aluminum/Poly-Silicon Composites" by S. Vaidya, Bell Laboratories, Appl. Phys. Lett. 39(11), 1981 American Institute of Physics, pp. 900–902.
"A New Type of Device Structure for Bipolar Logic IC's with Polysilicon Emitter Regions (PER)" by Jiang Xiangliu, Beijing Semiconductor Device Research Institute, Beijing, The People's Republic of China, 2 pages.
"Experimental Results on Submicron-Size p-Channel MOSFET's" by W. Fichtner, et al., IEEE Electron Device Letters, vol. EDL-3, No. 2, Feb. 1982, pp. 34–37.
"Oxidation Kinetics of As-Doped Polysilicon in a Steam Environment" by L., Baldi, et al., ECS Meeting, St. Louis, May 1980, 18 pages.
"Considerations for Scaled CMOS Source/Drains" by D. B. Scott, et al., Texas Instruments Incorporated, Central Research Laboratories, IEDM 81, IEEE 1981.
C. P. Ho, "Silicon Oxide Studies: Physical Modeling and Device Applications of Thermal Oxidation of Heavily Doped Silicon", Stanford Electronics Laboratories, Technical Report No. 4970-2, Nov. 1978.

*Primary Examiner*—Upendra Roy
*Attorney, Agent, or Firm*—J. T. Cavender; Casimer K. Salys

[57] ABSTRACT

A CMOS process utilizes preferential oxidation of arsenic-doped regions and the reduced diffusivity of boron in arsenic-doped regions to eliminate photomask steps and to form self-aligned enhanced p+ and n+ contacts.

8 Claims, 9 Drawing Figures

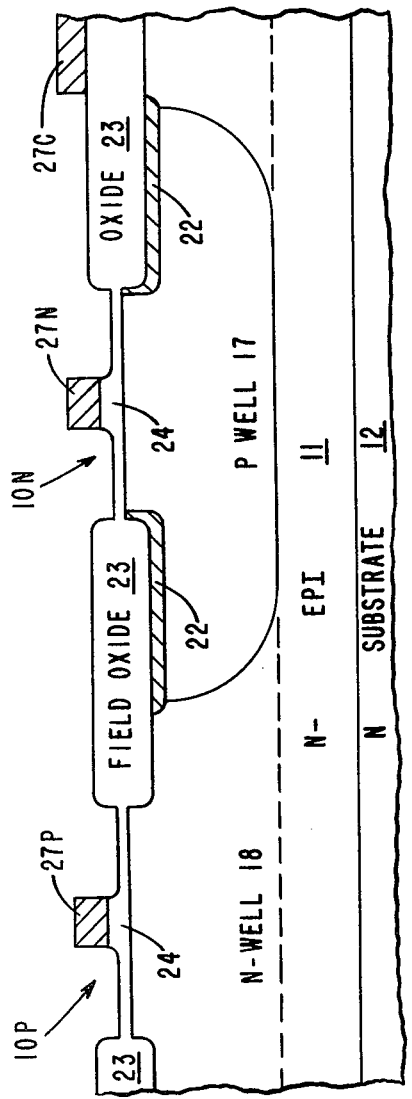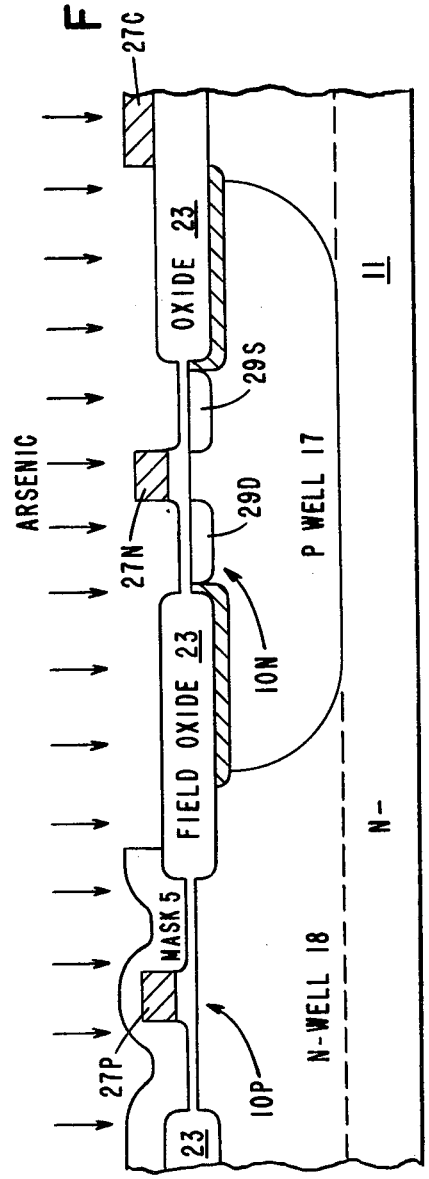

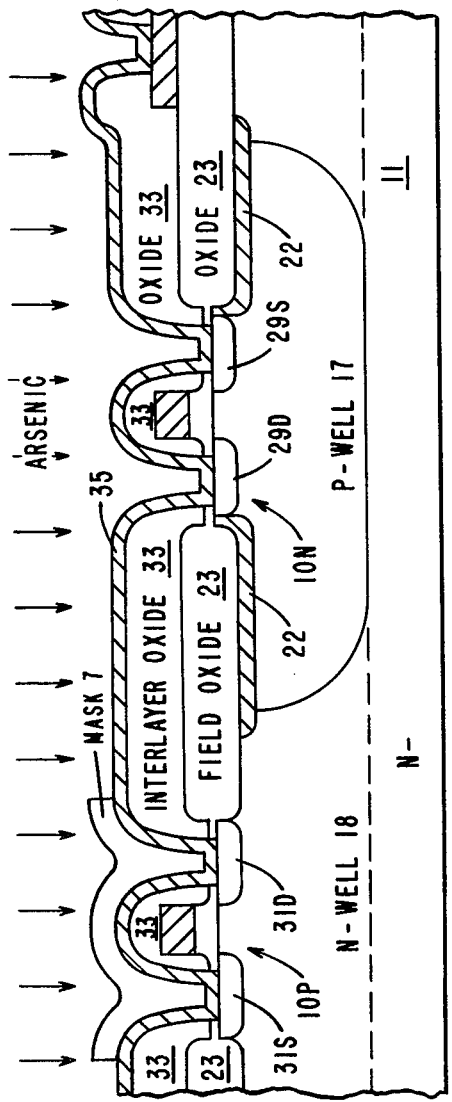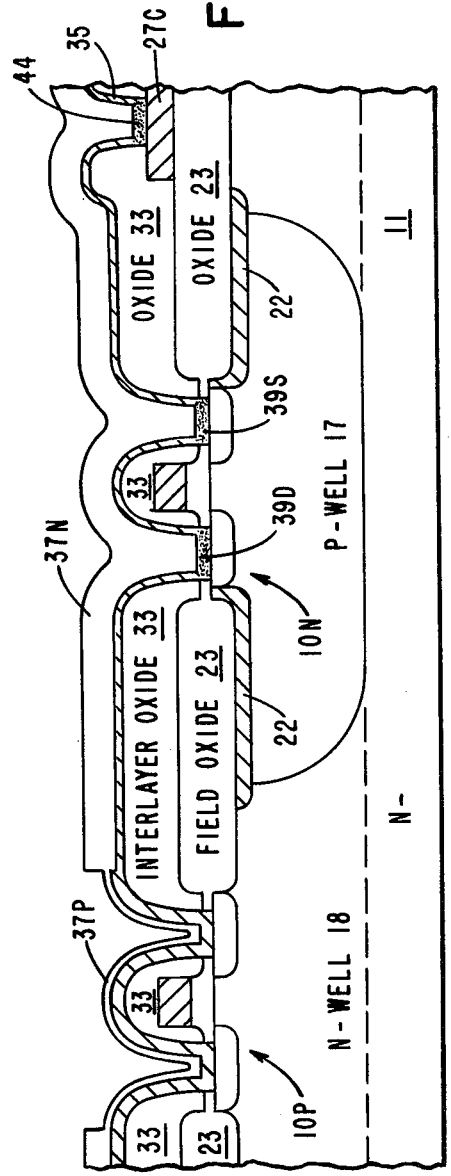

METHOD OF MAKING CMOS DEVICE AND CONTACTS THEREIN BY ENHANCED OXIDATION OF SELECTIVELY IMPLANTED REGIONS

BACKGROUND OF THE INVENTION

This invention relates to CMOS devices and fabrication processes and, in particular, to a process for forming state-of-the-art high performance silicon gate CMOS integrated circuits using a second polycrystalline silicon layer to provide enhanced metal-to-diffusion and metal-to-first layer polysilicon contacts.

The topographical and material properties of contact formation in MOSFET integrated circuits make this operation one of the most critical ones in the fabrication sequence. Contacts between two conductive materials, such as a metal and an underlying diffusion or polycrystalline silicon layer (also termed "poly" or "polysilicon") involve forming deep, steep-walled openings in an interlayer dielectric separating the two conductive layers. Aluminum contacts to diffusions often suffer from two problems: (1) metal spiking through the diffused junction, causing a short; and (2) metal necking or thinning at structural steps, causing increased susceptibility to electromigration-induced failure.

A consideration common to all contacts is the necessity for controlling the size and location with respect to the feature being contacted. Misalignment or oversizing causes short circuits with adjacent features. This possibility causes design rules to be expanded in order to avoid the nearby feature. Consequently, as overall circuit design rules shrink, minimum contact geometries and spacings can dominate other factors and determine the lower limit on device/cell sizes.

Additional problems arise in current, state-of-the-art processes in which the channel lengths typically are 3 microns or less and in which the source and drain junction depths are dimensionally very shallow (perhaps 0.3 micron) and the concentration of dopant such as arsenic, phosphorus or boron is low (approximately $1 \times 10^{20}/cm^3$ or less). Nonetheless, this concentration in short channel devices may result in high field effects such as punch-through and hot electron injection. Lowering the concentration to reduce or minimize such high field effects increases the contact resistance and may increase the tendency for metal spiking.

Each of these problems (spiking, electromigration instability and high field effects) has been addressed in various ways in different types of processes. Many manufacturing processes for n-channel MOSFET integrated circuits (NMOS, HMOS, XMOS, etc.) utilize "enhanced contact diffusion" or "ECD". This is an extra diffusion sequence in which an impurity such as phosphorus is diffused into the contact regions of the integrated circuit (after formation of the n-type source and drain) and after the formation of contact windows in the interlayer oxide to the source/drain. This diffusion increases the n+ junction depth and concentration locally under the subsequently-formed metal contacts. This permits the use of relatively low concentrations of source/drain dopant to minimize high field effects, at the same time reduces the incidence of metal spiking through the shallow, n+ junctions in the MOSFET devices, and decreases the contact resistance, with little increase in process complexity.

In another process (POSA), both metal spiking and contact alignment in NMOS integrated circuits are improved. See Hsia et al, "Polysilicon Oxidation Self-Aligned MOS (POSA MOS)-A New Self-Aligned Double Source/Drain Ion Implantation Technique for VLSI", *IEEE Electron Device Letters*, Vol. EDL-3, No. 2, pp. 40–42, February 1982. After forming a phosphorus-doped polysilicon gate and forming n− phosphorus source/drain regions, the rapid oxidation rate of the heavily-doped n+ polysilicon relative to the lightly-doped n− source/drain regions is used to form an implant mask displaced from and at the edge of the gate. The device is then given a "blanket" implant to provide a heavily doped n+, self-aligned, locally enhanced contact diffusion. The polysilicon oxidation self-aligned structure (POSA) provides several structural and operational improvements in addition to self-aligned ECDs, including increased circuit density.

The criticality of contact alignment to NMOS integrated circuit devices is reduced in a fabrication approach described by Sakamoto et al. in "A New Self-Aligned Contact Technology", *Proceedings of The International Solid State Circuits Conference*, pp. 136–39, February 1980. These investigators use differential oxidation of doped polysilicon gates to selectively form a high quality interlevel oxide over the gates. Large, doped polysilicon contact pads are then formed around the n+ regions prior to deposition of a second interlayer dielectric of phosphorus-silicate glass (PSG). Using this self-aligned ECD approach, alignment of the contact cuts through the PSG is not critical because the polysilicon contact pads overlap both the gate and the active area edge. Presumably, the source and drain area of the MOSFETs is decreased and the density of exemplary MOS dynamic random access memory (DRAM) cells is increased. However, the improvements are realized at the expense of increased parasitic capacitances, which would be expected to limit the usefulness of the technique.

State-of-the-art high performance bipolar junction transistors are described by Graul et al., "High-Performance Transistors with Arsenic-Implanted Polysil Emitters", *IEEE Journal of Solid-State Circuits*, Vol. SC-11, No. 4, August 1976, pp. 491–95. A primary feature of the fabrication process described by Graul et al. is the formation of the base by a single implantation with boron ions, followed by opening contact windows through a deposited oxide, depositing undoped polycrystalline silicon on the wafer, arsenic implanting the polysilicon, and then diffusing the arsenic into the base region to form a shallow emitter and a narrow base width. The advantages of the process, vis a vis conventional double-implanted transistors, include lower incidence of junction defects, higher emitter efficiency, self alignment of emitter contacts, and improved emitter-base junction breakdown. The polysilicon "interlayer" physically separates the metal from the junction and thereby decreases the diffusion or spiking of metal through the junction. The polysilicon may be partially consumed in a metal alloy step to raise the concentration of silicon solute to the solubility limit without spiking.

The problem of aluminum interconnect continuity over steps has been reduced by the application of a polysilicon underlayer beneath the aluminum metallization. However, the importance of maintaining a saturation percentage of silicon in the as-deposited aluminum has been reported by Vaidya who pointed out that such a two-layer Al/poly-si metallization will suffer from electromigration instability if the aluminum is pure. See Vaidya, "AL/Poly-Si Metallization For Small Geometry, Shallow Junction Contacts and Fine Line Interconnects", Abstract No. 228, *Electrochemical Society Extended Abstracts,* Spring Meeting, Montreal, Canada, May 9–14, 1982; and "Electromigration in Aluminum/Polysilicon Composites", *Applied Physics Letters,* Vol. 39, No. 11, pp. 900–902, December 1981.

An added benefit is obtained from the use of a doped polysilicon interlayer in contact regions, as reported by Jiang et al. in "A New Type of Bipolar Logic With Polysilicon Emitter Regions", *Electronic Science and Technology Journal* (Chinese), No. 7, pp. 7–12, 1980. Jiang et al. report the formation of bipolar junction transistors (BJTs) using doped polysilicon emitter regions (PER) involving a high quality planar junction between the doped poly and diffused substrate regions having opposite doping types. The implication of this type of junction for a polysilicon contact interlayer is that the contact will only be made to a region of doping which is the same as the doping in the polysilicon. Any adjacent feature which would be junction isolated in the substrate would also be junction isolated from the polysilicon contact. The main advantage of this characteristic would come from the ability to neglect the effects of partial contact misalignment and overetch at small junction isolated features. This would permit the implementation of design rules allowing tighter geometries, and would permit the formation of contact windows as large as, or even overlapping the active areas.

The use of enhanced n+ contact technology dual-layer aluminum/polysilicon metalization in CMOS circuits and combined CMOS/bipolar circuits is described in copending NCR U.S. patent application Ser. No. 391,068 filed June 22, 1982 in the name of Paul Sullivan.

Despite the above-described benefits of enhanced metal-to-diffusion contacts for n+ contacts or p+ contacts in MOS integrated circuits, ECD technology has not, to the knowledge of this inventor, been previously used for both p+ contacts and n+ contacts in CMOS integrated circuits. Since CMOS processes involve both NMOS and PMOS transistors, the ECD should be applied to the contacts to both n+ and p+ regions, such as source/drain regions. CMOS processes cannot merely employ a blanket implant and diffusion to produce the enhancement as can be done in NMOS. By standard processing, ECD must be implemented by separately masking and implanting the n+ and the p+ contact regions to increase the doping and the junction depth in both types of contacts. This requirement of two additional photomasking steps is not economically justifiable, particularly in large volume manufacturing. Consequently, in order to provide both low contact resistance and to reduce the incidence of spiking, many CMOS processes simply use higher than nominal source/drain doping concentrations and deeper than nominal junction depths.

An additional complicating factor occurs in forming enhanced p+ contacts in PMOS structures. In the absence of a poly interlayer, the high diffusivity of boron requires the use of complex processing to produce an adequately-protected junction under the contact and still maintain minimum lateral p+ diffusion. In PMOS, enhanced p+ contacts have been achieved for small devices in an exemplary process by using a triple boron implant at three different energies. See Fichtner et al., "Experimental Results in Submicron-Size p-Channel MOSFET's", *IEEE Electron Device Letters,* Vol. EDL-3, No. 2, February 1982, pp. 34–37.

SUMMARY OF THE INVENTION

The present invention is a process whereby the combined advantages of a polysilicon interlayer and enhanced metal-to-diffusion technology may be obtained for complementary MOS devices without additional photolithographic (mask) steps.

My process utilizes and requires the use of two unique properties of doped silicon. First, as previously discussed, silicon which is heavily doped with arsenic oxidizes at a much faster rate than undoped or p-type (boron-doped) silicon. This is termed "preferential oxidation". For example, the preferential oxidation rate of arsenic-doped (and/or phosphorus-doped) silicon may be 5–10 times higher than undoped or boron-doped silicon at a temperature of 700°–800° C. This relatively high oxidation rate of arsenic-doped silicon is used to selectively form oxide layers which serve as implantation masks. It is of paramount importance that my process is tailored to form the oxide masks at selected points in the process and utilizing other, required process steps so that additional masks are not required and, indeed, additional processing is minimized.

Secondly, my process utilizes the reduced diffusion rates of boron in arsenic-doped silicon. That is, boron diffuses relatively very slowly in silicon which is heavily doped with arsenic.

In carrying out my silicon gate CMOS process, conventional processes are followed through the formation of a first layer polysilicon gate. Then all p-type regions, such as the p-type active region, are masked with photoresist during the n-type source/drain doping step. The n-type areas are then preferentially oxidized during the anneal/drive-in step and the resulting oxide layer is used as an implant mask over the n-type regions during implantation of the p+ source and drain regions.

After forming an interlayer dielectric, cutting contact windows to the doped substrate regions, and forming a second polysilicon layer, the second preferential oxidation step is used to implement the enhanced contact doping process. In the second preferential oxidation process, the contact windows to p-type regions are masked with photoresist, and the wafer, including all contact openings to n-type contacts, is implanted with an n-type dopant such as arsenic or phosphorus. The n-type implanted surface is then preferentially oxidized and the resulting oxide layer is used as a mask during the implant of the p-type dopant into the polysilicon over the contact windows to p-type substrate regions. Subsequently, a short anneal removes implant damage and activates the implanted dopants with minimal diffusion of the underlying p+ and n+ source/drain junction depths.

The above process allows relatively unconstrained selection of p+ and n+ doses since only an implant tail from the boron will penetrate through the differential oxide masking layer to the n+ regions during the boron implant steps. Any such tail penetration is effectively confined by the presence of the arsenic, thereby protecting the n-device channel and leaving the NMOS device parameters unaltered.

In addition to the advantageous complementary use of preferential oxidation and enhanced metal-to-diffusion contact technology, the preferential oxide mask eliminates the use of photoresist during the boron implant. This eliminates any problem of boron ion-induced polymer cross-linking, which can cause resist strip problems and limit implant current as well as process throughput.

BRIEF DESCRIPTION OF THE DRAWING

FIGS. 1–9 are cross-sectional representations of a complementary metal oxide semiconductor (CMOS) wafer showing sequentially the major fabrication steps employed in implementing a preferred embodiment of the present invention.

DESCRIPTION OF THE PREFERRED EMBODIMENT

Figure 3:
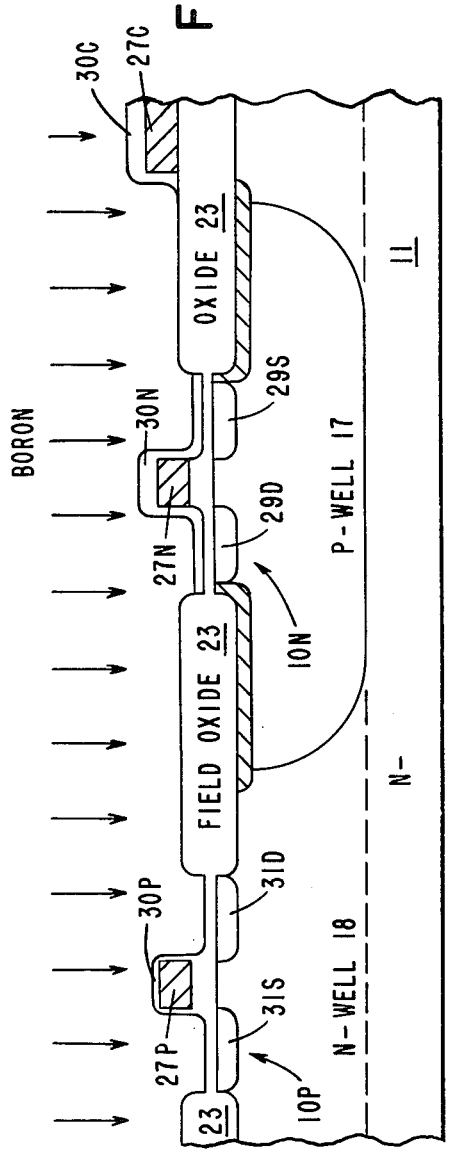

The present invention will be presented in the context of a p-well CMOS process employing a polysilicon gate, a locally oxidized isolation oxide and atmospheric pressure oxidation. There is, however, no restriction in its applicability to other approaches for forming silicon gate CMOS structures having arsenic N+ regions or to the use of other refractory gate materials such as molybdenum, polysilicon-silicide alloys, etc. Also, the selective, arsenic-enhanced oxidation described herein is part of a normal thermal activation/anneal cycle, but could be performed using a low temperature-high pressure oxidation approach. This latter approach substantially preserves the arsenic implant doping profile, except for an enhancement of arsenic concentration at the oxide/silicon interface.

In considering my invention in detail, please consider the cross-sectional representations of FIGS. 1–9. These non-scale drawings illustrate the sequence of major fabrication steps involved in constructing a CMOS structure using the invention. In particular, referring to FIG. 1, there is shown the starting point for application of the present process. The illustrated structure is intermediate to the overall process for forming a CMOS circuit. The partially-completed CMOS device 10 is based upon a lightly-doped, n-type silicon layer 11 of approximately 10 ohm-cm resistivity. Typically the layer 11 may have 1–20 ohm-cm resistivity and be either "epi" or bulk material. An "epi" (epitaxial) layer 11 would be formed on a heavily doped n-type substrate 12 such as 0.01 ohm-cm antimony- doped or arsenic- doped silicon. (To preserve drawing space, substrate 12 is not shown in FIGS. 2–9.) An epitaxial layer gives added SCR latch up protection in CMOS, but is not required for the present process.

The intermediate FIG. 1 structure has surface-adjacent p-well 17 and n-well 18. Actually, although "n-well" is used for simplicity of nomenclature here, 18 may be either an n-type surface-adjacent region in which the p-well 17 is formed or a separately-masked n-doped region. Both p-well 17 and n-well 18 are formed within any existing epitaxial region 11. Thick field isolation oxide regions 23—23 define active areas 10P and 10N for the subsequently formed PMOS and NMOS complementary devices, respectively.

The various approaches for fabricating the intermediate structure 10, FIG. 1, will readily be apparent to those skilled in the art. However, to describe one approach, the upper, surface-adjacent region of the epi layer 11 is given a phosphorus implant for ultimately forming the n-well 18. An oxide layer is deposited/grown. Using a photomask, the oxide is then formed into a mask which delineates the p-well region, and boron is implanted (mask 1; see TABLE). The wafer is subsequently given a thermal drive-in to diffuse the p-well 17 and n-well 18 to a depth of 3–6 microns. After stripping oxide mask 1, a dual-layer mask of oxide and nitride is provided, typically by growing an oxide layer, depositing a nitride layer and using a second photomask to form the nitride into a field oxidation mask (mask 2). Mask 2 covers the PMOS and NMOS active regions 10P and 10N, respectively.

TABLE

| Photomask Level | | | |
|---|---|---|---|
| Conventional CMOS Process (No ECD Structure) | | Present Invention (ECD Structure) | |
| 1. | P-well | 1. | P-well |
| 2. | Active Areas | 2. | Active Areas |
| 3. | Field Implant | 3. | Field Implant |
| 4. | Gates | 4. | Gates |
| 5. | N—channel S&D | 5. | N—channel S&D |
| 6. | P-channel S&D | 6. | Contact Cuts |
| 7. | Contact Cuts | 7. | N+Contacts |
| 8. | Metal | 8. | Metal |
| 9. | Silox Passivation | 9. | Silox Passivation |

Prior to oxidation of the field regions, a third photomasking step is used to delineate the p-well field regions 22—22, then these regions are implanted using boron, to improve the field inversion threshold. Next, the isolation oxide 23 is grown in the field regions in the presence of the oxide-nitride mask. Subsequently, the oxide-nitride mask is itself removed and gate oxide layer 24 is grown in the active device regions 10P and 10N to a thickness of 650 Angstroms. The wafer is then given a blanket implant to adjust the ultimate n-channel and p-channel threshold voltages to their desired values.

To complete the FIG. 1 structure, a layer 27 of polycrystalline silicon 0.5 microns thick is deposited on the wafer and doped using n-type dopant such as phosphorus to provide the desired conductivity. The gate regions are masked, as by photoresist (mask 4), and the polysilicon is etched by plasma or a wet chemical etchant to form the PMOS and NMOS gates 27P and 27N and interconnect 27C. Mask 4 is then removed and the gate oxide is etched back to a thickness of about 400 Angstroms to allow subsequent ion implant penetration.

The crucial steps of my invention are illustrated commencing with FIG. 2. As shown there, a photomask is applied to cover the PMOS device areas (mask 5), then the wafer is implanted with arsenic to form source 29S and drain 29D which are self-aligned with the gate 27N of NMOS device 10N. After mask 5 is stripped, the first arsenic-enhanced oxide mask 30N is formed during the furnace operation which diffuses the arsenic to the desired junction depth. See FIG. 3. To achieve a junction depth of 0.4 microns and to form the differential oxide mask 30N, we have used a masked arsenic implant of $5 \times 10^{15}$ cm$^{-2}$, 80 keV and a furnace cycle which consists of inserting the wafer into a furnace at relatively low temperature (e.g. 600° C.) and a ramp up to approximately 750° C. for implant annealing; a 750° C., 120 minute preferential oxidation in steam; and then a diffusion at 900° C. for 60 minutes in nitrogen to drive-in the arsenic to the desired junction depth.

The resulting oxide mask 30N has a thickness of about 1500–2000 Angstroms in the arsenic source/drain regions 29S and 29D and the arsenic-implanted gate 27N (FIG. 3). The exact time of oxidation and oxide growth depends on the arsenic dose as well as the selected drive-in temperature. For the exemplary $5 \times 10^{15}$ cm$^{-2}$ dose and 750° C. preferential oxidation temperature, the 120 minute oxidation operation suffices to form the 1500–2000 Angstrom oxide thickness. Elsewhere, layer 30P comprises about 100-200 Angstroms of additional oxide over the unimplanted areas which will later become the P+ source and drain regions and approximately 650 Angstroms of oxide on the phosphorus-doped polysilicon gate 27P.

After oxidation, the wafer is subjected to a short dip etch to etch back the oxide 30P to the original implant oxide thickness of approximately 400 Angstroms. After this etch, oxide mask 30N is still approximately 1300-1700 Angstroms thick over the N+ regions such as 10N.

The P+ implant (boron or BF$_2$) is now carried out as a "blanket" implant, as illustrated in FIG. 3. A boron implant of $5\times10^{15}$cm$^{-2}$, 30 keV provides PMOS source and drain 31S and 31D of 0.65 microns junction depth after a subsequent 950° C., fifteen minute, furnace diffusion cycle in oxygen. In addition to forming the PMOS source/drain regions, this sequence is also used to simultaneously form other p+ diffusions, such as p-well contacts. Please note, it is not necessary to strip the oxide mask 30.

The foregoing sequence allows relatively unconstrained selection of the P+ and N+ doses, since only an implant "tail" from the boron will penetrate the mask 30N to the N+ regions. It should be explained that the word "tail" refers to a low boron doping concentration profile which consists of those few boron atoms which penetrate all the way through the oxide 30N. Such tail penetration is effectively confined by the presence of the arsenic. These boron atoms do not diffuse out of the arsenic-doped source/drain regions because the presence of arsenic greatly reduces the diffusion coefficient of boron. Consequently the boron has no effect on any of the NMOS device parameters.

Still another advantage arises from the absence of a photoresist mask on the wafers during the boron implant. That is, the elimination of the photoresist mask (mask 6 of conventional process; see TABLE) eliminates any problem of boron ion-induced polymer cross-linking which can cause resist strip problems and limit the implant current as well as process throughput.

The above-mentioned brief, 15 minute oxygen anneal cycle also forms an oxide layer on the polysilicon gates. This oxide layer provides better dielectric integrity between the polysilicon gates and the subsequently deposited metal, in conjunction with interlayer dielectric 33.

Figure 4:
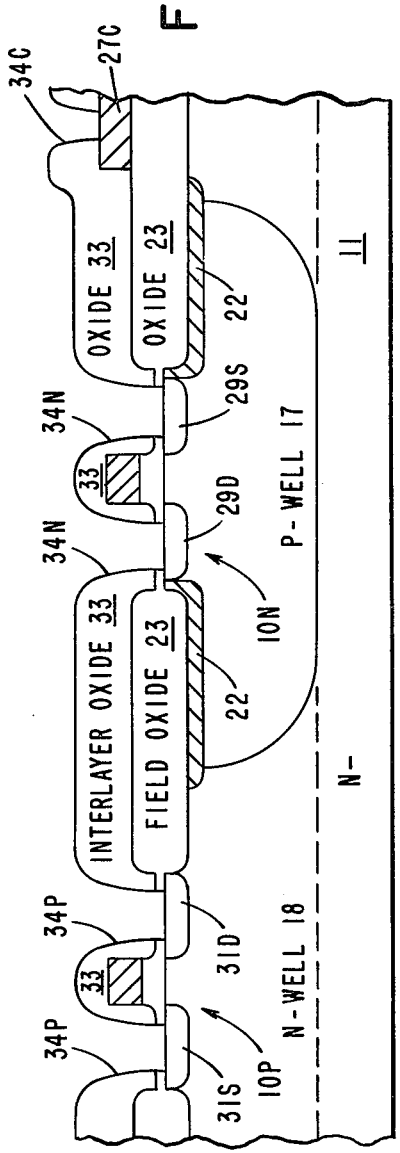

As shown in FIG. 4, interlayer dielectric 33 (0.7 microns thick silicon dioxide) is then deposited on the wafer. Various techniques may be used, including chemical vapor deposition at atmospheric pressure or low pressure, or plasma enhanced deposition. A photomask (mask 6; not shown) is used to delineate the contact locations in the deposited oxide, and contact cuts or windows are etched, as by plasma etching or by wet chemical etching in a buffered solution of ammonium fluoride and hydrogen fluoride. The photoresist mask is now stripped. It should be noted that FIG. 4 illustrates five contact cuts. There are two each of cuts 34N and 34P to the PMOS and NMOS sources and drains, while cut 34C is for contact to the polysilicon 27C. It is unlikely that these five contact cuts would appear in the same vertical cross-section in an actual fabrication sequence. Rather, they are shown in this manner to facilitate illustration.

The next phase of the fabrication sequence implements ECD contacts. Referring to FIG. 5, a layer 35 of undoped polysilicon is deposited on the wafer to a thickness of 0.2-0.5 microns. Photoresist mask 7 is applied to cover the PMOS active areas 10P and all p+ diffusions. All regions not covered by mask 7 are implanted using arsenic ($5\times10^{15}$ to $2\times10^{16}$cm$^{-2}$ dose, 80 keV).

Referring to FIG. 6, after stripping mask 7, a thermal cycle in an oxidizing atmosphere (750° C., four hours in steam) forms a preferentially-grown, 0.4 micron thick oxide mask 37N over the arsenic-doped N+ polysilicon regions and forms oxide 37P of about only 800 Angstroms thickness in the undoped regions. This thermal cycle also provides oxidation-enhanced drive-in of the arsenic implant.

Figure 7:
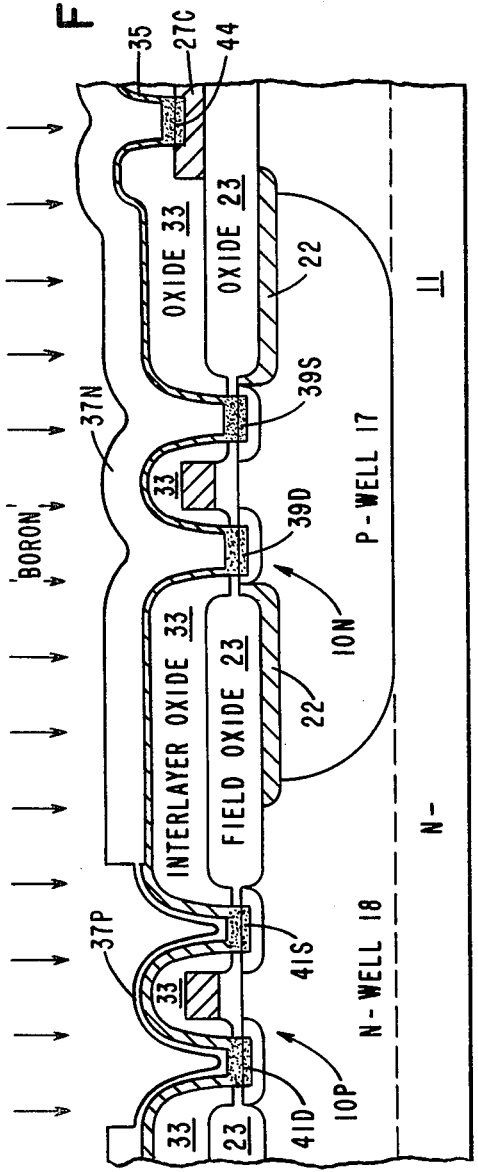

Next, and referring to FIG. 7, a "blanket" boron implant and an anneal/drive-in are undertaken, to form highly doped regions 41S and 41D which produce enhanced contacts to the p+ source and drain regions 31S and 31D. The boron is effectively masked from the n-type contact areas by oxide 37N. The P+ anneal/drive-in is at 900° C. for 30 minutes.

This anneal/drive-in also enhances the poly-to-n+ contacts. That is, the high degree of segregation of arsenic from the oxide grown on the poly 35 combined with the slow diffusion of arsenic in silicon dioxide increases the arsenic concentration at the oxide-poly interface above the poly-to-n+ contacts 39S and 39D and accelerates diffusion of the arsenic dopant into the N+ below. This establishes highly doped N+ regions 39S and 39D and thereby provides ECD source and drain contacts to the n-channel device 10N. It also forms highly doped N+ region 44 and thereby provides improved contact between the polysilicon 27C and the subsequently-deposited metallization 42.

Figure 8:
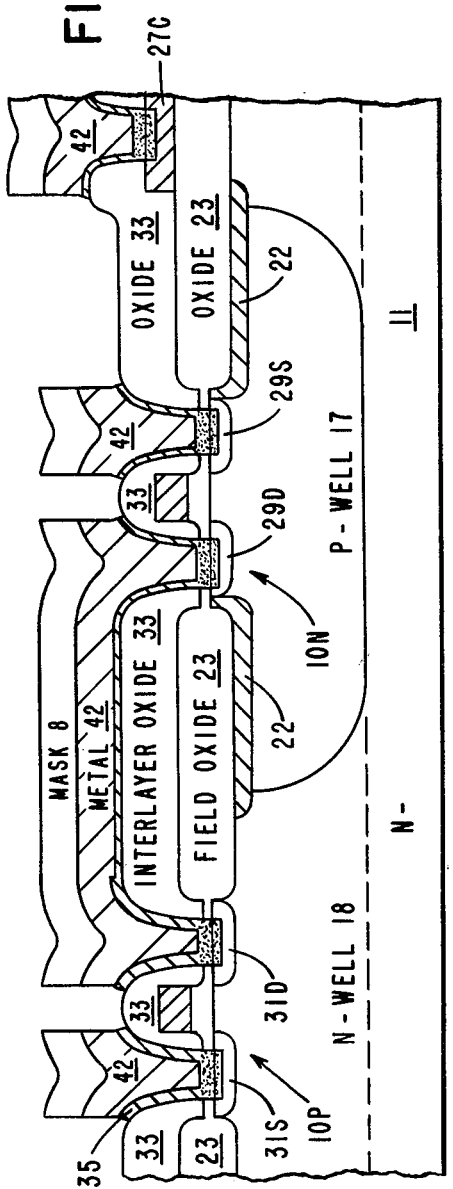

Referring to FIG. 8, after an oxide strip to remove the oxide 37 from the poly II layer 35, conductor layer 42 such as aluminum (or an aluminum alloy) is deposited on the wafer and is etched in the presence of photomask 8 to define conductor interconnections. The wafer is then dip-etched approximately 30 seconds in polysilicon etchant or plasma etched to everywhere remove the polysilicon 35 except under the aluminum interconnections, then mask 8 is removed.

Figure 9:
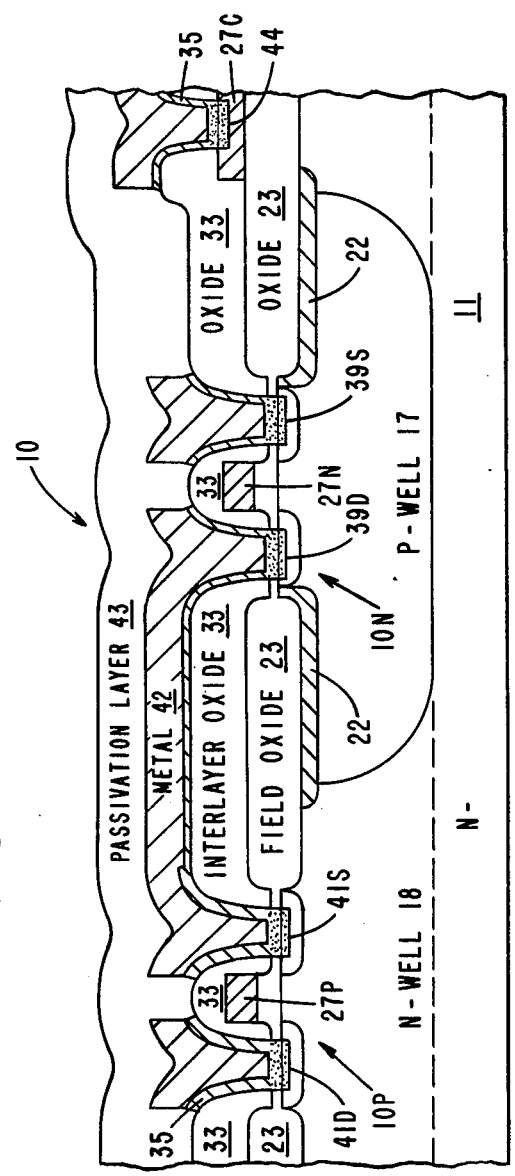

Referring to FIG. 9, a passivation layer 43 is now deposited. As will be appreciated by those skilled in the art, it may be the more usual process to form additional interlayer dielectrics and additional conductor/metal interconnection layers prior to the final passivation layer. Finally, mask 9 (not shown) is used to define openings in the passivation layer over metal bonding pads, the mask is removed and an alloying heat treatment is applied.

The final CMOS structure 10 shown in FIG. 9 exhibits the advantages previously outlined for enhanced polysilicon interlayer contact processes, yet requires no additional photomask steps as compared to the standard CMOS process. Referring to the TABLE, it is seen that the present process with its ECD formation sequence utilizes nine photolithographic mask formation steps. Thus, the present process provides enhanced contacts using the same number of mask steps as the exemplary conventional CMOS process, which does not provide enhanced contacts. The N+ contact mask (mask 7 in the present process) is added while the conventional p-channel mask (mask 6) is deleted. If ECD contacts were not to be formed in the present process, N+ contact mask 7 would be unnecessary, thereby resulting in the elimination of one photolithographic masking step as compared to the conventional process. If a conventional enhanced contact diffusion were to be applied to the conventional process, that process would require two additional photolithographic mask steps as compared to the present process, to separately mask the N+ and P+ ECD implant steps. Thus, my process effectively saves two photolithographic masking steps if ECD structures are fabricated.

While the present exemplary process is compared to and is an improvement of a nine-mask process that is believed representative of current state-of-the-art CMOS processing, the benefits are by no means limited thereto. If the present invention were applied to a different CMOS process, for example, to one having a greater number of mask steps, the same relative savings in the number of mask steps and the other benefits would nonetheless result. These savings and benefits are the result of the use of the phenomena of preferential oxidation and retarded boron diffusivity in heavily doped arsenic regions.

Having described a preferred embodiment of my invention, it will be apparent to those skilled in the art that various modifications may be made without departing from the disclosed principles of the invention. Thus, the invention is limited only by the attached claims.

I claim:

1. In a process for forming complementary metal-oxide-semiconductor substrate devices in a wafer having regions defined therein for n-channel and p-channel devices which contain insulated gate structures, the sequence comprising:
   selectively implanting the wafer with n-type dopant, excluding one or more selected regions which includes the p-channel device region;
   heating the wafer in an oxidizing atmosphere for driving-in the n-type dopant to form the n-channel device source and drain and other n-doped regions, while also forming a first oxide masking layer on the implanted-implanted surfaces; and
   using the first oxide masking layer as a mask, doping the wafer with a p-type dopant to form the p-channel device source and drain and other p-doped regions.

2. In a process for forming complementary metal-oxide-semiconductor substrate devices in a wafer having regions defined therein for n-channel and p-channel devices which contain insulated gate structures, the sequence comprising:
   selectively implanting the wafer with n-type dopant, excluding one or more selected regions which includes the p-channel device region;
   heating the wafer in an oxidizing atmosphere for driving-in the n-type dopant to form the n-channel device source and drain and other n-doped regions, while also forming a first oxide masking layer on the implanted-implanted surfaces;
   using the first oxide masking layer as a mask, doping the wafer with a p-type impurity to form the p-channel device source and drain and other p-doped regions;
   removing the first oxide masking layer;
   forming on the wafer an interlayer dielectric layer having openings to selected contact regions including openings to the n-type and p-type substrate contact regions associated with the n-channel and p-channel devices;
   forming a silicon layer on the wafer;
   selectively doping the silicon layer with n-type dopant, excluding one or more selected regions which includes the p-channel device region;
   heating the wafer in an oxidizing atmosphere for diffusing the n-type dopant to increase the dopant concentration at the silicon-to-n-type substrate contact regions and to simultaneously and selectively form a second oxide masking layer at the n-doped surfaces of the silicon layer; and
   using the second oxide masking layer as a mask, doping the wafer with a p-type dopant to increase the p-type dopant concentration at the p-type contact region.

3. The process of claim 1 or 2 further comprising:
   removing the second oxide masking layer;
   depositing a layer of metal on the wafer;
   selectively patterning the resulting dual layer of metal-silicon to form interconnections; and
   forming a dielectric isolation layer over the wafer.

4. The process of claim 3 wherein the gates are silicon, the n-type dopant is arsenic, and the p-type dopant is boron.

5. The process of claim 3 wherein subsequent to the second step of doping the wafer with a p-type impurity dopant, the wafer is heated to establish the n-type and the p-type dopant concentrations at the respective silicon-to-substrate contact regions.

6. The process of forming improved contacts in a CMOS structure having insulated gate NMOS and PMOS devices and n-type and p-type contact regions formed in a semiconductor substrate, comprising:
   forming a layer of silicon over the structure;
   selectively doping regions of the silicon with one of the n-type dopants arsenic or phosphorus, the selected doped regions including silicon regions contacting n-type substrate contact regions;
   heating the structure in an oxidizing atmosphere for diffusing the n-type dopant to thereby increase the dopant concentration at the contact between the silicon-to-n-type substrate contact regions and for simultaneously and selectively forming an oxide masking layer at the n-type doped surface regions of the silicon layer;
   using the oxide layer as a mask, doping the silicon with p-type dopant; and
   heating the structure to diffuse the n-type and p-type dopants to thereby increase the dopant concentration at the respective silicon-to-n-type substrate and silicon-to-p-type substrate contacts.

7. The process of claim 6 wherein the n-type dopant is arsenic.

8. The process of claim 6 or 8 wherein the p-type dopant is boron.

* * * * *